United States Patent [19]

Bertieri et al.

[11] Patent Number: 5,782,036
[45] Date of Patent: Jul. 21, 1998

[54] DISABLED PERSONS MULTIPLE APPLIANCE/WINDOW REMOTE CONTROL SYSTEM

[75] Inventors: Fiorenza Bertieri, 211 W. 53rd St., Apt. 4-F, New York, N.Y. 10019; Richard L. Miller, Dix Hills, N.Y.

[73] Assignee: Fiorenza Bertieri, New York, N.Y.

[21] Appl. No.: 644,310

[22] Filed: May 10, 1996

Related U.S. Application Data

[60] Continuation-in-part of Ser. No. 368,977, Jan. 5, 1995, abandoned, which is a division of Ser. No. 234,124, Apr. 28, 1994, abandoned.

[51] Int. Cl.$^6$ ........................................ E05F 15/20
[52] U.S. Cl. ........................................................ 49/25
[58] Field of Search .............................. 49/25; 318/53, 318/266, 331, 430, 469

[56] References Cited

U.S. PATENT DOCUMENTS

| | | | |
|---|---|---|---|
| D. 313,398 | 1/1991 | Gilchrist | D13/168 |
| 3,665,447 | 5/1972 | Bidwell et al. | 49/25 X |
| 4,168,594 | 9/1979 | Tuchiya et al. | 49/325 |
| 4,334,388 | 6/1982 | Kambic | 49/14 |
| 4,360,801 | 11/1982 | Duhame | 340/521 |
| 4,366,482 | 12/1982 | Remes et al. | 340/825.69 |
| 4,464,651 | 8/1984 | Duhame | 340/521 |
| 4,544,865 | 10/1985 | Sharp | 318/53 |
| 4,544,866 | 10/1985 | Clemmons et al. | 318/54 |
| 4,866,434 | 9/1989 | Keenan | 340/825.72 |
| 5,226,256 | 7/1993 | Fries et al. | 49/13 |
| 5,287,109 | 2/1994 | Hesse | 341/176 |
| 5,341,166 | 8/1994 | Garr et al. | 348/10 |
| 5,410,326 | 4/1995 | Goldstein | 348/134 |

FOREIGN PATENT DOCUMENTS

| | | | |
|---|---|---|---|
| 4106289 | 4/1992 | Japan | E05F 15/20 |
| 4202987 | 7/1992 | Japan | E05F 15/04 |

*Primary Examiner*—Jerry Redman
*Attorney, Agent, or Firm*—Richard L. Miller, P.E.

[57] ABSTRACT

A disabled persons multiple appliance and window remote control system that allows a disabled person to remotely and automatically operate at least one of at least one appliance and at least one window by merely aiming a remote control at any of the at least one of the at least one appliance and the at least one window regardless of which one of the at least one of the at least one appliance and the at least one window the disabled person desires to operate that includes a programmable infrared remote control and a separate and local control system. The programmable infrared remote control has an infrared transmitter that generates separate infrared signals associated with each of the at least one of the at least one appliance and the at least one window. And, the separate and local control system is associated and in electrical communication with each of the at least one of the at least one appliance and the at least one window and with each other and receives the infrared signal from the programmable infrared remote control, so that the disabled person can remotely and automatically operate the at least one of the at least one appliance and the at least one window by merely aiming the programmable infrared remote control at any the separate and local control system associated with any of the at least one of the at least one appliance and the at least one window regardless of which one of the at least one of the at least one appliance and the at least one window the disabled person desires to operate.

16 Claims, 3 Drawing Sheets

DISABLED PERSONS MULTIPLE APPLIANCE/WINDOW REMOTE CONTROL SYSTEM

CROSS REFERENCE TO RELATED APPLICATIONS

The instant application is a Continuation-in-Part of application Ser. No. 08/368,977, now abandoned, filed Jan. 5, 1995. Application Ser. No. 08/368,977, filed Jan. 5, 1995 is a Divisional of application Ser. No. 08/234,124, filed Apr. 28, 1994 now abandoned.

BACKGROUND OF THE INVENTION

The present invention relates to a remote control device. More particularly, the present invention relates to a disabled persons multiple appliance and window remote control device that allows a disabled person to remotely and automatically operate at least one of at least one appliance and at least one window by merely aiming a remote control at any of the at least one of the at least one appliance and the at least one window regardless of which one of the at least one of the at least one appliance and the at least one window the disabled person desires to operate that includes a programmable infrared remote control and a separate and local control system.

Unfortunately, many persons who suffer from disease, such as cerebral palsy, multiple sclerosis or the like, or injury, such a spinal cord or the like, are left with limited mobility in their upper extremities.

Complications from these diseases and injuries can render a person wheelchair bound or bedridden. A person in this position, not only finds it difficult to enjoy the pleasures of life but also finds it difficult to accomplish simple tasks, such opening and closing windows and operating appliances needed for daily survival.

The impact on a persons independence is enormous. Congress taking this into consideration has past the Americans with Disabilities Act whereby every effort is to be made to assist a disabled person in becoming independent. Ramps have been installed in buildings and bathrooms have been modified to accept persons in wheelchairs, to name a few.

Applicant is an advocate for the disabled and has provided a device that will allow a disabled person with limited mobility in their upper extremities or bedridden to control windows and appliances remotely from a hospital bed or a wheelchair.

Numerous innovations for remote control devices have been provided in the prior art that will be described. Even though these innovations may be suitable for the specific individual purposes to which they address, however, they differ from the present invention in that they do not teach a disabled persons multiple appliance and window remote control device that allows a disabled person to remotely and automatically operate at least one of at least one appliance and at least one window by merely aiming a remote control at any of the at least one of the at least one appliance and the at least one window regardless of which one of the at least one of the at least one appliance and the at least one window the disabled person desires to operate that includes a programmable infrared remote control and a separate and local control system.

FOR EXAMPLE, U.S. Pat. No. Des. 313,398 to Gilchrist teaches the ornamental design for an electronic window remote control that includes a rectangular-shaped panel suspended from a chain with a ring and having disposed thereon a keypad.

ANOTHER EXAMPLE, U.S. Pat. No. 4,168,594 to Tuchiya et al. teaches a remote controller for hinged window that includes a flexible cable with one end operatively connected to a free end portion of the window, a cable guide member for guiding the cable, an operating device connected to the cable to longitudinally move the same causing opening and closing movements of the window when operated, and a one-way brake mechanism for braking the longitudinal movements of the cable induced by the opening and closing movements of the window while freely permitting the movements of the cable via the operation of the operating device.

STILL ANOTHER EXAMPLE, U.S. Pat. No. 4,334,388 to Kambic teaches a door position monitoring assembly that includes track apparatus for mounting with respect to a horizontal edge of a door and movable therewith, and a circuit component such as a switch mounted with respect to a stationary surface of the door installation such as the door frame or the threshold. A control arm is provided to mechanically link the door to the switches wherein the control arm has one end thereof slidably connected to the track apparatus and being pivotally mounted proximate the other end thereof to the door frame. Actuator apparatus is provided interconnecting the pivotally mounted end of the control arm and the circuit component.

YET ANOTHER EXAMPLE, U.S. Pat. No. 4,360,801 to Duhame teaches a home security and garage door operating system that includes a gas sensor for detecting the level of toxic gas in the garage. Lock out circuitry is provided for preventing the door from being accidentally closed as long as the gas sensor detects an excessive level of toxic gas in the garage. A two button transmitter is used to sequentially close the garage door and set a security alarm subsystem. Warning devices are activated if the security alarm is attempted to be set without the garage door and windows in the home being closed. A central control module in the garage includes a receiver with channel monitoring circuitry designed to detect the state of the control bit to initiate different functions.

STILL YET ANOTHER EXAMPLE, U.S. Pat. No. 4,366,482 to Remes et al. teaches a garage door opener system that includes a radio receiver actuable by reception of a preselected radio signal for moving a garage door between opened and closed positions and a portable hand-held transmitter manually actuable to transmit such preselected radio signal to the receiver.

YET STILL ANOTHER EXAMPLE, U.S. Pat. No. 4,464,651 to Duhame teaches a home security and garage door operating system that includes a gas sensor for detecting the level of toxic gas in the garage. Lock out circuitry is provided for preventing the door from being accidentally closed as long as the gas sensor detects an excessive level of toxic gas in the garage. A two button transmitter is used to sequentially close the garage door and set a security alarm subsystem. Warning devices are activated if the security alarm is attempted to be set without the garage door and windows in the home being closed. A central control module in the garage includes a receiver with channel monitoring circuitry designed to detect the state of the control bit to initiate different functions.

STILL YET ANOTHER EXAMPLE, U.S. Pat. No. 4,544,865 to Sharp teaches a window operating system that includes a motor control circuit for controlling the operation of direct current permanent magnet motors mounted on window operators associated with each window. Each of the motors on each of the windows is connected to the control circuit only by a pair of wires which both power the motor and provide information to the control circuit as to the status of motor operation.

YET STILL ANOTHER EXAMPLE, U.S. Pat. No. 4,544,866 to Clemmons et al. teaches a window operating system that includes a motor control circuit for controlling the operation of direct current permanent magnet motors mounted on window operators associated with each window. Each of the motors on each of the windows is connected to the control circuit only by a pair of wires which both power the motor and provide information to the control circuit as to the status of motor operation. A reversible connector is used to connect the motor to the control circuit so that the polarity of motor operation can be reversed by reversal of the connector relative to its mating receptacle.

STILL YET ANOTHER EXAMPLE, U.S. Pat. No. 4,866,434 to Keenan teaches a multi-band universal remote control hand unit that stores compressed device control codes to make efficient use of the available memory space. In addition to storing data pointers to pairs of pulse off and pulse burst components of a transmission, the memory also stores data indicative of several characteristics of transmissions within a given brand of devices to be controlled.

YET STILL ANOTHER EXAMPLE, U.S. Pat. No. 5,226,256 to Fries et al. teaches a window system in which windows which can be both locked and tilted mechanically are connected via microprocessors to a monitoring center which can display the locking and closure status of the individual windows via visual display units. The microprocessors are located in the vicinity of the windows and connected to the receiver of a radio-controlled remote control unit by which the windows can be remotely controlled. The windows can also be controlled via an operating unit in the monitoring center. The remote control unit may involve either portable transmitters or transmitters with a fixed location which control the windows via sensors as a function of ambient air parameters, such as the relative air humidity, temperature or the carbon dioxide content of the air in the room. The windows have a locking drive integrated in the handle and a separate tilting drive. A central blocking device which blocks the microprocessors permits central blocking of individual windows or all the windows in the system.

The function of Fries et al. is to provide a window system for a building that utilizes radio-control and whose transmission line 47 sends the closure status of each window to a central control center:

"The microprocessors 43 are in turn connected via a data ring cable 47 to a spatially remote monitoring center 49 in which the locking and closure status of the individual windows is displayed . . ."[col. 10 lines 19–22 of Fries et al.] [Emphasis added]

In contradistinction, however, the function of the present invention is to provide a remote window control system that utilizes infrared control and uses the conventional AC power lines in a home to connect individual local window control systems to each other and not to a central controller as taught by Fries et al.

The conventional power lines carry the power signals that operate the appliance or the window mechanisms associated with each window to each other and not to a central controller for displaying closure status.

The individual local window control systems are removably plugged into the conventional AC power lines of the home via the conventional outlets contained therealong:

" . . . the separate and local appliance/window control system 40 is partially enclosed in a housing 48 which is replaceably plugged into the home conventional AC power lines 44 in the home 34 by way of a home conventional AC power line wall socket 46."[Emphasis added]

If the local window control system receives an infrared signal from the remote that is not its own, it will send the signal through the conventional AC power lines to the appropriate window control system and vise versa:

"In response to the received remote control infrared signal 13 of the infrared remote control 12, each separate and local appliance/window control system 40 is capable of operating its respective appliance 15 or respective window 22 if the received remote control infrared signal 13 of the infrared remote control 12 is associated with it, or alternatively communicating with the respective separate and local appliance/window control system 40 for the appliance 15 or the window 22 for which the received remote control infrared signal 13 of the infrared remote control 12 is associated."[Emphasis added]

"Alternatively, however, when the infrared receiver 14 of one of the separate and local appliance/window control systems 40 receives the remote control infrared signal 13 of the infrared remote control 12 that is not associated with its appliance 15 or its window 22, which ever the case may be, the appliance/window controller 16 sends the power line signal 39 over the home conventional AC power lines 44 in the home 34 using the power line transceiver 42, so that the disabled person does not have to move or reorient themselves to operate the desired appliance 15 or window 22." [Emphasis added]

As shown, the function of the present invention is different than that of Fries et al. Fries et al. use radio control signals for remote activation of only windows and teaches a transmission line that is connected from each window to a central controller for monitoring the closure status of each window whereas the present invention use infrared signals for remote activation of appliances in addition to windows and teaches a power line that interconnects each local appliance/window control system to each other for busing back and forth the associated power signals.

This difference in function between Fries at al. and the present invention must be considered in determining if the present invention is obvious over Fries et al. Support for this assertion can be found in the Board of Appeals decision in *Ex parte Tanaka, Marushima and Takahashi*, 174 USPQ 38 where the Board held:

"Claims can not be rejected on the ground that it would be obvious to one of ordinary skill in the art if it does not accomplish applicant's result."[Emphasis added]

STILL YET ANOTHER EXAMPLE, U.S. Pat. No. 5,287,109 to Hesse teaches a programmable remote control that includes a processor with an input for entering command and time of command information for the function to be performed, a memory for storing the information entered at the input, a real time clock, a comparator for comparing time of the real time clock with the time of command information in the memory, and an actuator for effecting a command signal for a particular command when the time of command information stored in the memory for that particular command matches the time on the real time clock.

YET STILL ANOTHER EXAMPLE, U.S. Pat. No. 5,341,166 to Garr et al. teaches a control system that includes a VCR tape to distribute the codes and a decoder. The VCR tape contains data pertaining to the control codes of all devices of interest. To configure the system for a particular device, the tape is played in a VCR and the user designates the device of interest. The decoder receives the data being read from the tape, and stores that data which pertains to the device of interest.

STILL YET ANOTHER EXAMPLE, U.S. Pat. No. 5,410,326 to Goldstein teaches a universal remote control device which is programmed to operate a variety of consumer products that is connected over a bi-directional link to either a cable convertor or a telephone interface for receiving programming information. A touch screen display is employed on the programmable remote control device for displaying icons of functions to be selected. By selecting a particular displayed icon, a command can be decoded and sent via an infrared link to one or more appliances.

YET STILL ANOTHER EXAMPLE, Japanese Patent No. 4-106289 teaches an electric glass louver window controller wherein when the controller is manually operated, an electric glass louver window is selected in a required position. When the operation is instructed, control signals constituted of address/control signals are transmitted to a control unit.

FINALLY, STILL YET ANOTHER EXAMPLE, Japanese Patent No. 4-202987 teaches a fully automatic window opening/closing device by hydraulic control that includes a control panel and a hydraulic unit arranged on a ceiling side, and an operation box at a normal position.

It is apparent that numerous innovations for remote control devices have been provided in the prior art that are adapted to be used. Furthermore, even though these innovations may be suitable for the specific individual purposes to which they address, they would not be suitable for the purposes of the present invention as heretofore described.

SUMMARY OF THE INVENTION

Applicant is an advocate for the disabled and has provided a device that will allow a disabled person with limited mobility in their upper extremities to control windows and appliances remotely from a hospital bed or a wheelchair.

The present invention allows the disabled person to merely orient a infrared remote control only once towards any separate and local control system associated with a window or appliance and that local control system determines the appropriate window or appliance the disabled person desires to operate.

If the local control system aimed at by the disabled person, however, is not associated with the window or appliance the disabled person desires to operate, no additional orienting of the remote control is necessary by the disabled person and thereby freeing the disabled person from further movement which could be quite difficult, if not impossible.

The local control system receiving the signal will automatically send the signal through the conventional AC power lines of the facility in which the disabled person is located to the appropriate local system associated with the window or appliance the disabled person desires to operate.

ACCORDINGLY, AN OBJECT of the present invention is to provide a disabled persons multiple appliance/window remote control device that avoids the disadvantages of the prior art.

ANOTHER OBJECT of the present invention is to provide a disabled persons multiple appliance/window remote control device that is simple and inexpensive to manufacture.

STILL ANOTHER OBJECT of the present invention is to provide a disabled persons multiple appliance/window remote control device that is simple to use.

YET ANOTHER OBJECT of the present invention is to provide a disabled persons multiple appliance/window remote control device that automatically opens or closes any window in a home and/or automatically operates any appliance in the home.

STILL YET ANOTHER OBJECT of the present invention is to provide a disabled persons multiple appliance and window remote control device that allows a disabled person to remotely and automatically operate at least one of at least one appliance and at least one window by merely aiming a remote control at any of the at least one of the at least one appliance and the at least one window regardless of which one of the at least one of the at least one appliance and the at least one window the disabled person desires to operate that includes a programmable infrared remote control and a separate and local control system.

YET STILL ANOTHER OBJECT of the present invention is to provide a disabled persons multiple appliance/window remote control device wherein the programmable infrared remote control has an infrared transmitter that generates separate infrared signals associated with each of the at least one of the at least one appliance and the at least one window.

STILL YET ANOTHER OBJECT of the present invention is to provide a disabled persons multiple appliance/window remote control device wherein the separate and local control system is associated and in electrical communication with each of the at least one of the at least one appliance and the at least one window and with each other and receives the infrared signal from the programmable infrared remote control, so that the disabled person can remotely and automatically operate the at least one of the at least one appliance and the at least one window by merely aiming the programmable infrared remote control at any the separate and local control system associated with any of the at least one of the at least one appliance and the at least one window regardless of which one of the at least one of the at least one appliance and the at least one window the disabled person desires to operate.

YET STILL ANOTHER OBJECT of the present invention is to provide a disabled persons multiple appliance/window remote control device wherein the programmable infrared remote control includes a hand-held housing that has a keypad, an infrared transmitter, and a programming receiver, so that the programmable infrared remote control can be programmed to mimic signals produced by various remote controls to control their associated appliances.

STILL YET ANOTHER OBJECT of the present invention is to provide a disabled persons multiple appliance/window remote control device wherein the keypad of the hand-held housing of the programmable infrared remote control is in electrical communication with a memory unit.

YET STILL ANOTHER OBJECT of the present invention is to provide a disabled persons multiple appliance/window remote control device wherein the infrared transmitter of the hand-held housing of the programmable infrared remote control is in electrical communication with the memory unit of the programmable infrared remote control and transmits the infrared signal of the programmable infrared remote control in response to a button pressed on the keypad of the hand-held housing of the programmable infrared remote control.

STILL YET ANOTHER OBJECT of the present invention is to provide a disabled persons multiple appliance/window remote control device wherein the programming receiver of the hand-held housing of the programmable infrared remote control is in electrical communication with the memory unit of the programmable infrared remote control so as to allow the programmable infrared remote control to be programmed by other remote control units associated with various other appliances.

YET STILL ANOTHER OBJECT of the present invention is to provide a disabled persons multiple appliance/window remote control device wherein the infrared remote control is programmed by receiving infrared signals from the other remote control units by way of the programming receiver of the hand-held housing of the programmable infrared remote control.

STILL YET ANOTHER OBJECT of the present invention is to provide a disabled persons multiple appliance/window remote control device wherein the memory unit of the programmable infrared remote control contains memory for storing code sequences associated with functions of the other remote control units, so that the programmable infrared remote control may subsequently mimic the code sequences and when an appropriate button on the keypad of the hand-held housing of the programmable infrared remote control is pressed, the programmable infrared remote control transmits, from the infrared transmitter of the hand-held housing of the programmable infrared remote control, signals identical to those received from the other remote control units during programming.

YET STILL ANOTHER OBJECT of the present invention is to provide a disabled persons multiple appliance/window remote control device wherein each separate and local control system includes an infrared receiver and a power line transceiver associated with each of the at least one of the at least one appliance and the at least one window and for communicating with other the separate and local control systems, so that when the power infrared receiver associated with the at least one of the at least one appliance and the at least one window detects presence of an associated the infrared signal of the programmable infrared remote control the associated one of the at least one of the at least one appliance and the at least one window is operated and when the infrared receiver of the separate and local control system receives the infrared signal of the programmable infrared remote control detects presence of the infrared signal of the programmable infrared remote control that is not associated with the one of the at least one of the at least one appliance and the at least one window the separate and local control systems sends a power line signal over conventional AC power lines in a home using the power line transceiver, so that the disabled person does not have to move or reorient themselves to operate the desired one of the at least one of the at least one appliance and the at least one window.

STILL YET ANOTHER OBJECT of the present invention is to provide a disabled persons multiple appliance/window remote control device wherein the power line transceiver is capacitively linked to the conventional AC power lines in the home by capacitor, so that the capacitor allows the power line signal to enter the power line transceiver but substantially prevents power from the conventional AC power lines in the home from entering the power line transceiver and thereby prevents damage to the power line transceiver.

YET STILL ANOTHER OBJECT of the present invention is to provide a disabled persons multiple appliance/window remote control device wherein the separate and local control system is partially enclosed in a housing which is replaceably plugged into the conventional AC power lines in the home by way of a conventional AC power line wall socket.

STILL YET ANOTHER OBJECT of the present invention is to provide a disabled persons multiple appliance/window remote control device wherein the infrared receiver is mounted in the housing at a position where it is in a direct line of sight with a large area of its environment.

YET STILL ANOTHER OBJECT of the present invention is to provide a disabled persons multiple appliance/window remote control device wherein the separate and local control system further includes a local switch that is mounted on the housing for locally manually actuating the associated one of the at least one of the at least one appliance and the at least one window, if so desired.

STILL YET ANOTHER OBJECT of the present invention is to provide a disabled persons multiple appliance/window remote control device wherein the housing of the separate and local control system has an appliance socket that is identical to the conventional AC power line wall socket which replaceably receives a conventional appliance plug of the at least one of at least one appliance and at least one window is an appliance.

YET STILL ANOTHER OBJECT of the present invention is to provide a disabled persons multiple appliance/window remote control device that further includes a dedicated receiver for receiving the infrared signal of the programmable infrared remote control and transmitting the power line signal over the home conventional AC power lines in the home using a dedicated power line transmitter when the programmable infrared remote control is not within range of any the infrared receiver, so that the dedicated receiver can act in effect as a relaying mechanism when the disabled person can not be moved in the range of the infrared receiver of any the separate and local control system.

STILL YET ANOTHER OBJECT of the present invention is to provide a disabled persons multiple appliance/window remote control device that further includes a timer for allowing the at least one of the at least one appliance and the at least one window to operate automatically without the disabled person having to manually operate the programmable infrared remote control each time operation thereof is desired.

YET STILL ANOTHER OBJECT of the present invention is to provide a disabled persons multiple appliance/window remote control device that further includes a window power relay and a window motor operatively connected to each window when any of the at least one of the at least one appliance and the at least one window is a window.

STILL YET ANOTHER OBJECT of the present invention is to provide a disabled persons multiple appliance/window remote control device wherein each the window power relay controlling an associated the window motor upon receiving the infrared signal associated with a particular window of the at least one window.

FINALLY, YET STILL ANOTHER OBJECT of the present invention is to provide a method of allowing a disabled person to remotely and automatically operate at least one of at least one appliance and at least one window by merely aiming a remote control at any of the at least one of the at least one appliance and the at least one window regardless of which one of the at least one of the at least one appliance and the at least one window the disabled person desires to operate that includes the step of interfacing the at least one of the at least one appliance and the at least one window to a disabled persons multiple appliance and window remote control device which includes a programmable infrared remote control having an infrared transmitter generating separate infrared signals associated with each of the at least one of the at least one appliance and the at least one window, and a separate and local control system being associated and in electrical communication with each of the at least one of the at least one appliance and the at least one window and with each other and receiving the infrared signal from the programmable infrared remote control, so that the disabled person can remotely and automatically operate the at least one of the at least one appliance and the at least one window by merely aiming the programmable infrared remote control at any the separate and local control system associated with any of the at least one of the at least one appliance and the at least one window regardless of which one of the at least one of the at least one appliance and the at least one window the disabled person desires to operate.

The novel features which are considered characteristic of the present invention are set forth in the appended claims. The invention itself, however, both as to its construction and its method of operation, together with additional objects and advantages thereof, will be best understood from the following description of the specific embodiments when read and understood in connection with the accompanying drawing.

BRIEF DESCRIPTION OF THE DRAWING

The figures on the drawing are briefly described as follows.

LIST OF REFERENCE NUMERALS UTILIZED IN THE DRAWING 10 disabled persons multiple appliance remote control system of the present invention
12 infrared remote control
13 remote control infrared signal
14 infrared receiver
15 at least one appliance
16 appliance/window controller
17 optional timer
18 window power relay
19 optional buzzer
20 window operating motor
22 window
22H sliding window
22V vertical opening window
24 remote control hand-held housing
26 remote control hand-held housing keypad
28 remote control hand-held housing infrared transmitter
30 remote control hand-held housing programming receiver
32 remote control memory unit
34 home
39 power line signal
40 separate and local appliance/window control system
41 window mechanism
42 power line transceiver
44 home conventional AC power lines
45 capacitor
46 home conventional AC power line wall socket
47 local switch
48 housing
49 housing appliance socket
50 dedicated receiver
52 dedicated infrared receiver
54 dedicated power line transmitter
56 television
58 wheelchair or hospital bed

DETAILED DESCRIPTION OF THE PREFERRED EMBODIMENTS

Figure 1:
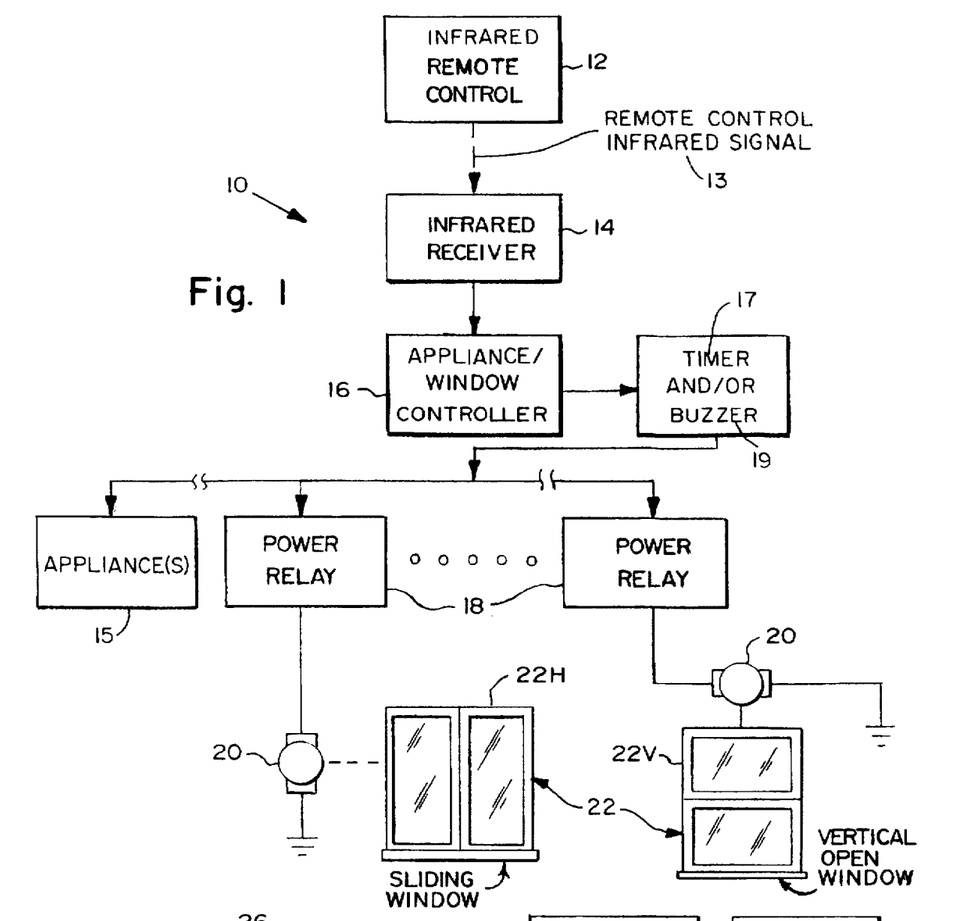
FIG. 1 is a block diagram of a first embodiment of the present invention.

Referring now to the figures in which like numerals indicate like parts, and particularly to FIG. 1, which is a block diagram of a first embodiment of the present invention, the disabled persons multiple appliance remote control device of the present invention is shown generally at 10 and includes an infrared remote control 12, an infrared receiver 14, and an appliance/window controller 16 for controlling at least one appliance 15.

It is to be understood, however, that when at least one of the at least one appliance 15 is a window 22, a window power relay 18 and an associated window operating motor 20 are utilized and control a respective window 22 of the at least one appliance 15.

An optional timer 17 can be used which will allow the at least one appliance 15 and the window 22 when at least one of the at least one appliance 15 is the window 22 to operate automatically without the disabled person having to manually press the infrared remote control 12 each time operation thereof is desired.

An optional buzzer 19 can be used which will sound for a short time prior to the actual operation of the at least one appliance 15 and the window 22 when at least one of the at least one appliance 15 is the window 22 and provides a warning that the at least one appliance 15 and the window 22 when at least one of the at least one appliance 15 is the window 22 is going the be operational and thereby preventing accidents from occurring.

The infrared remote control 12 generates a remote control infrared signal 13 that is received by the infrared receiver 14 which is in electrical communication with the appliance/window controller 16 which in turn is in electrical communication with at least one appliance 15 and to the window power relay 18 when at least one of the at least one appliance 15 is the window 22.

Two examples of the case when at least one of the at least one appliance 15 is the window 22 includes a window operating motor 20 that is operatively connected to a sliding window 22H and another window operating motor 20 that is operatively connected to a vertical opening window 22V. Upon receiving the remote control signal 13 of the infrared remote control 12 from the infrared remote control 12 that is associated with a particular window 22, by the infrared receiver 14, the appliance/window controller 16 signals the power relay 18 associated with the window 22 to be operated. The window 22 is operated by its associated motor 20.

The configuration of the infrared remote controller 12 can best be seen in FIGS. 2 and 3, and as such will be discussed with reference thereto.

Figure 2:
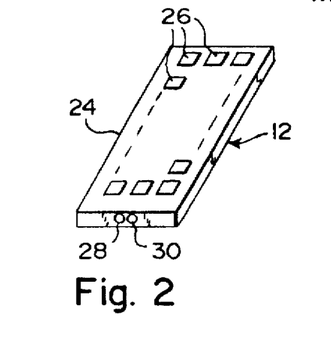
FIG. 2 is a diagrammatic perspective view of just the remote controller of the present invention.

As shown in FIG. 2, which is a diagrammatic perspective view of just the remote controller of the present invention, the infrared remote control 12 is comprised of a remote control hand-held housing 24. The remote control hand-held housing 24 has a remote control hand-held housing keypad 26, a remote control hand-held housing infrared transmitter 28, and a remote control hand-held housing programming receiver 30.

The remote control 12 is of a "universal" type. A universal remote control mimics the signals produced by various remote controls to control their associated appliances. Therefore, the infrared remote control 12 is programmable, allowing it to perform the functions of several other remote control units from various appliances. The remote control hand-held housing keypad 26 of the remote control hand-held housing 24 of the infrared remote control 12 has buttons with indicia for suitable uses in controlling televisions, video recorders, stereos, and indicia indicating various window locations.

Figure 3:
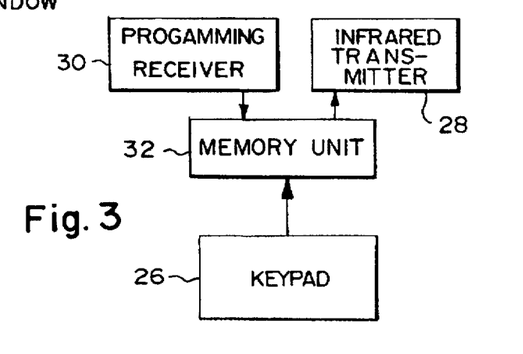
FIG. 3 is a block diagram of the remote controller of the present invention.

As shown in FIG. 3, which is a block diagram of the remote control of the present invention, the remote control hand-held housing keypad 26 of the remote control hand-held housing 24 of the infrared remote control 12 is in electrical communication with a remote control memory unit 32.

The remote control hand-held housing infrared transmitter 28 of the remote control hand-held housing 24 of the infrared remote control 12 is also in electrical communication with the remote control memory unit 32 of the infrared remote control 12 and transmits the remote control infrared signal 13 of the infrared remote control 12 in response to a button being pressed on the remote control hand-held housing keypad 26 of the remote control hand-held housing 24 of the infrared remote control 12. The infrared remote control 12 transmits different infrared signals associated with each of the at least one appliance 15 in the remote window control system 10 and each window 22 when at least one of the at least one appliance 15 is the window 22.

The remote control hand-held housing programming receiver 30 of the remote control hand-held housing 24 of the infrared remote control 12 is also in electrical communication with the remote control memory unit 32 of the infrared remote control 12 so as to allow the infrared remote control 12 to be programmed by other remote control units associated with various other appliances.

The infrared remote control 12 is programmed by receiving infrared signals from the other remote control units by way of the remote control hand-held housing programming receiver 30 of the remote control hand-held housing 24 of the infrared remote control 12.

The remote control memory unit 32 of the infrared remote control 12 contains memory for storing code sequences associated with the functions of the other remote control units, so that the infrared remote control 12 may subsequently mimic these code sequences.

When an appropriate button on the remote control hand-held housing keypad 26 of the remote control hand-held housing 24 of the infrared remote control 12 is pressed, the infrared remote control 12 transmits, from the remote control hand-held housing infrared transmitter 28 of the remote control hand-held housing 24 of the infrared remote control 12, signals identical to those received from the other remote control units during programming.

The configuration of a second embodiment of the present invention can best be seen in FIGS. 4–6A, and as such will be discussed with reference thereto.

Figure 4:
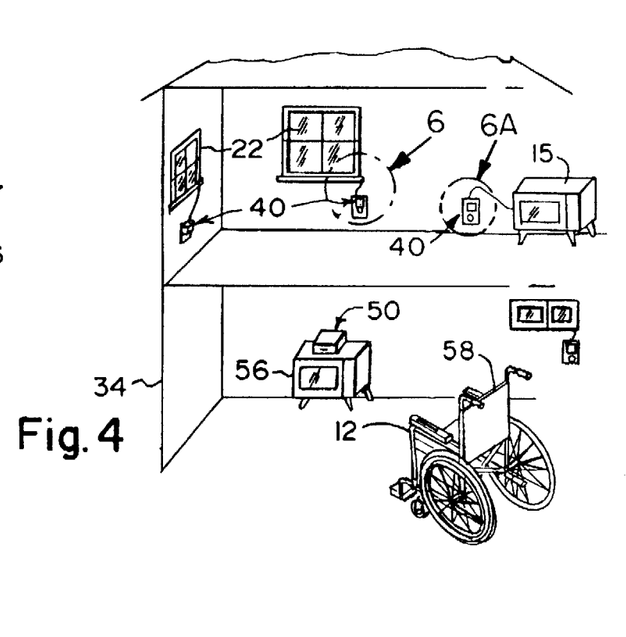
FIG. 4 is a diagrammatic perspective view of a house with a second embodiment of the present invention installed therein.

As shown in FIG. 4, which is a diagrammatic perspective view of a house with a second embodiment of the present invention installed therein, the second embodiment of the present invention includes a separate and local appliance/window control system 40 located at each of the at least one appliance 15 and at each window 22 when at least one of the at least one appliance 15 is the window 22 in a home 34.

Each separate and local appliance/window control system 40 is associated with one of the at least one appliance 15 and with each window 22 of the at least one appliance 15 when at least one of the at least one appliance 15 is the window 22.

Each separate and local appliance/window control system 40 is capable of receiving the remote control infrared signal 13 of the infrared remote control 12 from the infrared remote control 12. In response to the received remote control infrared signal 13 of the infrared remote control 12, each separate and local appliance/window control system 40 is capable of operating its respective appliance 15 or respective window 22 if the received remote control infrared signal 13 of the infrared remote control 12 is associated with it, or alternatively communicating with the respective separate and local appliance/window control system 40 for the appliance 15 or the window 22 for which the received remote control infrared signal 13 of the infrared remote control 12 is associated.

Figures 5, 6A, 7:
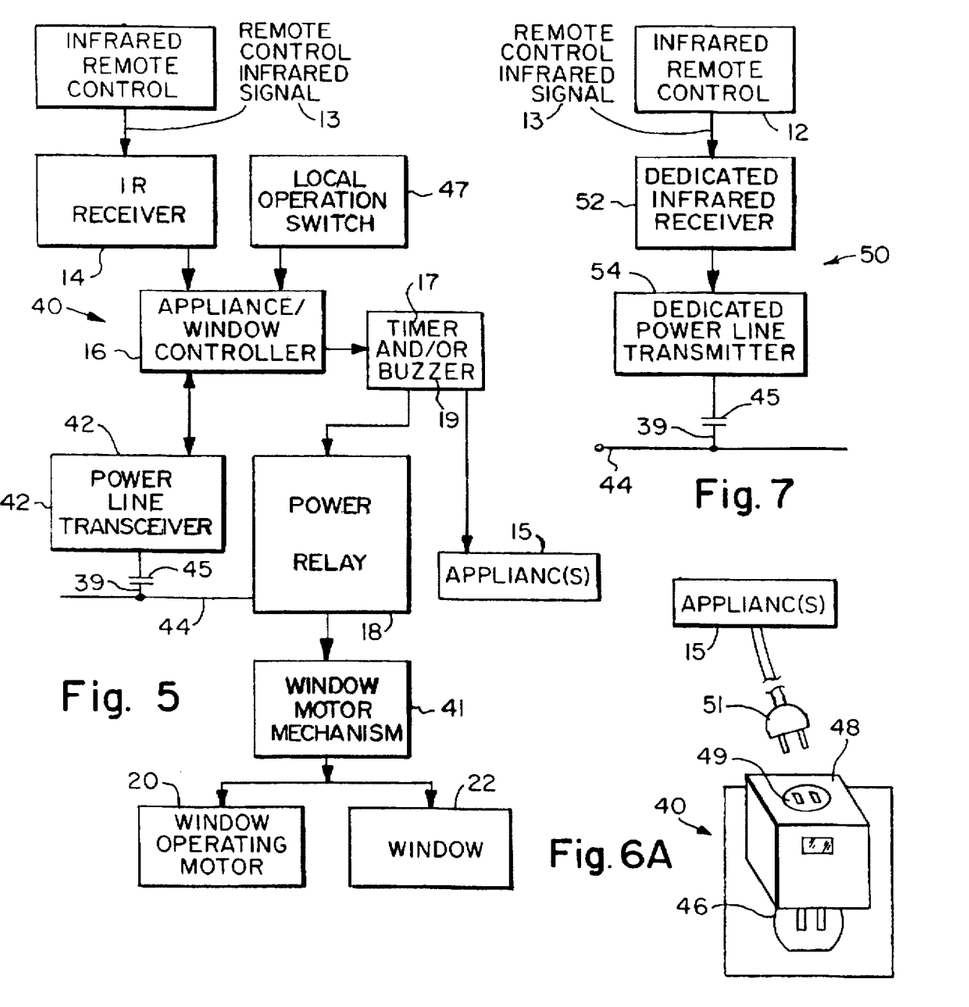
FIG. 5 is a block diagram of the second embodiment of the present invention.
FIG. 6A is an enlarged diagrammatic perspective view of the area encircled by dotted circle identified by arrow 6A in FIG. 4 when the present invention is connected to an appliance.
FIG. 7 is a block diagram of a third embodiment of the present invention.

As shown in FIG. 5, which is a block diagram of the second embodiment of the present invention, the separate and local appliance/window control system 40 is similar to the disabled persons multiple appliance remote control device 10 of the first embodiment, except that each appliance/window controller 16 is in electrical communication with only one appliance 15 or only one window 22. In the case of window 22 connection is made via the power relay 18 that is associated with a window mechanism 41 at which the separate and local appliance/window control system 40 is located. The window mechanism 41 comprises the window operating motor 20 and the window 22.

The appliance/window controller 16 is also in electrical communication with a power line transceiver 42 for communicating with other separate and local appliance/window control systems 40. The power line transceiver 42 is capacitively linked to home conventional AC power lines 44 in the home 34 by capacitor 45.

The capacitor 45 substantially prevents the power from entering the power line transceiver 42 but allows the signal portion to enter the power line transceiver 42 and thereby prevents damage to the signal portion circuitry from the power, as a result of the inherent nature of the capacitor 45.

The impedance of a capacitor is inversely proportional to the frequency of the voltage or current attempting to pass through it, so that with a relatively low frequency typically 60 cycles, the capacitor presents a high value of impedance at power source frequencies while at signal frequencies which are much greater than 60 cycles the capacitor presents itself as a low impedance, so that the signal can be transmitted into the power line easily.

When the power line transceiver 42 of the appropriate separate and local appliance/window control system 40 detects the presence of a power line signal 39 associated with it. In turn, its appliance/window controller 16 will operate its associated appliance 15 or its associated window power relay 18 and window motor mechanism 41 when the appliance 15 is the window 22, which ever the case may be.

Alternatively, however, when the infrared receiver 14 of one of the separate and local appliance/window control systems 40 receives the remote control infrared signal 13 of the infrared remote control 12 that is not associated with its appliance 15 or its window 22, which ever the case may be, the appliance/window controller 16 sends the power line signal 39 over the home conventional AC power lines 44 in the home 34 using the power line transceiver 42, so that the disabled person does not have to move or reorient themselves to operate the desired appliance 15 or window 22.

Figure 6:
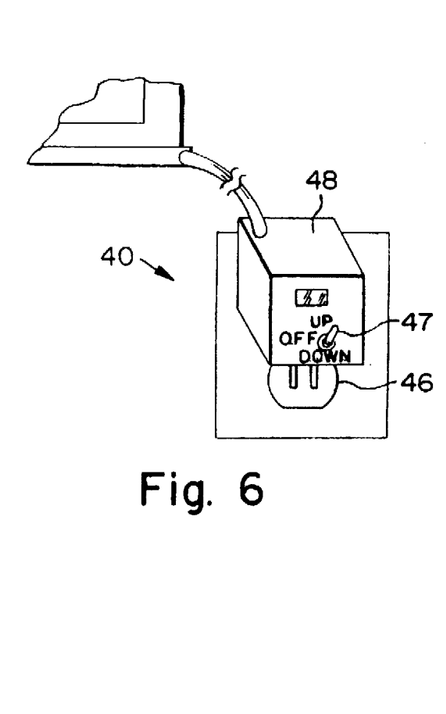
FIG. 6 is an enlarged diagrammatic perspective view of the area encircled by dotted circle identified by arrow 6 in FIG. 4 when the present invention is connected to a window.

As shown in FIG. 6, which is an enlarged diagrammatic perspective view of the area encircled by dotted circle identified by arrow 6 in FIG. 4 when the present invention is connected to a window, the separate and local appliance/window control system 40 is partially enclosed in a housing 48 which is replaceably plugged into the home conventional AC power lines 44 in the home 34 by way of a home conventional AC power line wall socket 46. The infrared receiver 14 is mounted in the housing 48 at a position where it is in a direct line of sight with a large area of its environment. A local switch 47 is mounted on the housing 48 for locally manually actuating the window mechanism 41, if so desired by an aide or the like.

As shown in FIG. 6A, which is an enlarged diagrammatic perspective view of the area encircled by dotted circle identified by arrow 6A in FIG. 4 when the present invention is connected to an appliance, the separate and local appliance/window control system 40 is partially enclosed in the housing 48 which is replaceably plugged into the home conventional AC power lines 44 in the home 34 by way of the home conventional AC power line wall socket 46 in the home 34. The infrared receiver 14 is mounted in the housing 48 at a position where it is in a direct line of sight with a large area of its environment.

The housing 48 has a housing appliance socket 49 that is identical to the home conventional AC power line wall socket 46 in the home 34 and is in electrical communication with the separate and local appliance/window control system 40 and which replaceably receives a conventional appliance plug 51 of the appliance 15.

The configuration of a third embodiment of the present invention can best be seen in FIG. 7, which is a block diagram of a third embodiment of the present invention, and as such will be discussed with reference thereto.

A dedicated receiver 50 is employed in conjunction with the system according to the second embodiment. Thus, the dedicated receiver 50 receives the remote control infrared signal 13 of the infrared remote control 12 from the infrared remote control 12 via a dedicated infrared receiver 52 which transmits the power line signal 46 over the home conventional AC power lines 44 in the home 34 using a dedicated power line transmitter 54.

The dedicated receiver 50 may be located anywhere in the home 34 that is not within the range of the infrared receivers 14 of one of the separate and local appliance/window control systems 40 and thereby can act in effect as a relaying mechanism when the disabled person can not be moved in the range of the infrared receivers 14 of one of the separate and local appliance/window control systems 40. The dedicated receiver 50 should be installed at a location normally convenient to the infrared remote control 12.

For example, as shown in FIG. 6, the dedicated receiver 50 can be located on top of a television 56. Since the remote control 12 can be used to control the television 56 from a wheelchair or hospital bed 58 near the television 56, it can also be used to operate any of the appliances and/or windows 22 in the home 34 by merely aiming the infrared remote control 12 at the dedicated receiver 50.

Additionally, the dedicated receiver 50 can be located near the window 22, so that authorized persons outside the home 34 can use another infrared remote control 12 having suitable programming to open one of the windows 22. For example, law enforcement, rescue and medical personnel could aim their infrared remote control 12 into one of the windows 22 at the suitably situated dedicated receiver 50 to gain access to the home 34 if the disabled person is unable to operate the infrared remote control themselves for whatever reason.

It will be understood that each of the elements described above, or two or more together, may also find a useful application in other types of constructions differing from the types described above.

While the invention has been illustrated and described as embodied in a disabled persons multiple appliance/window remote control device, it is not limited to the details shown, since it will be understood that various omissions, modifications, substitutions and changes in the forms and details of the device illustrated and its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute characteristics of the generic or specific aspects of this invention.

The invention claimed is:

1. A disabled persons multiple appliance and window remote control system that allows a disabled person to remotely and automatically operate at least one of at least one appliance and at least one window by merely aiming a remote control at any of the at least one of the at least one appliance and the at least one window regardless of which one of the at least one of the at least one appliance and the at least one window the disabled person desires to operate, comprising:

a) a programmable infrared remote control having an infrared transmitter generating separate infrared signals associated with each of the at least one of the at least one appliance and the at least one window; and b) a separate and local control system being associated and in electrical communication with each of the at least one of the at least one appliance and the at least one window and with each other and receiving said infrared signal from said programmable infrared remote control, so that the disabled person can remotely and automatically operate the at least one of the at least one appliance and the at least one window by merely aiming said programmable infrared remote control at any said separate and local control system associated with any of the at least one of the at least one appliance and the at least one window regardless of which one of the at least one of the at least one appliance and the at least one window the disabled person desires to operate; each separate and local control system including an infrared receiver and a power line transceiver associated with each of the at least one of the at least one appliance and the at least one window and for communicating with other said separate and local control systems, so that when said power line infrared receiver associated with the at least one of the at least one appliance and the at least one window detects presence of an associated said infrared signal of said programmable infrared remote control, the associated one of the at least one of the at least one appliance and the at least one window is operated and when said infrared receiver of said separate and local control system receives said infrared signal of said programmable infrared remote control detects presence of said infrared signal of said programmable infrared remote control that is not associated with the one of the at least one of the at least one appliance and the at least one window, said separate and local control systems sends a power line signal over conventional AC power lines in a home using said power line transceiver.

2. The system as defined in claim 1, wherein said programmable infrared remote control includes a hand-held housing that has a keypad, an infrared transmitter, and a programming receiver, so that said programmable infrared remote control can be programmed to mimic signals produced by various remote controls to control their associated appliances.

3. The system as defined in claim 2, wherein said keypad of said hand-held housing of said programmable infrared remote control is in electrical communication with a memory unit.

4. The system as defined in claim 3, wherein said infrared transmitter of said hand-held housing of said programmable infrared remote control is in electrical communication with said memory unit of said programmable infrared remote control and transmits said infrared signal of said programmable infrared remote control in response to a button pressed on said keypad of said hand-held housing of said programmable infrared remote control.

5. The system as defined in claim 3, wherein said programming receiver of said hand-held housing of said programmable infrared remote control is in electrical communication with said memory unit of said programmable infrared remote control so as to allow said programmable infrared remote control to be programmed by other remote control units associated with various other appliances.

6. The system as defined in claim 5, wherein said infrared remote control is programmed by receiving infrared signals from the other remote control units by way of said programming receiver of said hand-held housing of said programmable infrared remote control.

7. The system as defined in claim 6, wherein said memory unit of said programmable infrared remote control contains memory for storing code sequences associated with functions of the other remote control units, so that said programmable infrared remote control may subsequently mimic said code sequences and when an appropriate button on said keypad of said hand-held housing of said programmable infrared remote control is pressed, said programmable infrared remote control transmits, from said infrared transmitter of said hand-held housing of said programmable infrared remote control, signals identical to those received from the other remote control units during programming.

8. The system as defined in claim 1, wherein said power line transceiver is capacitively linked to the conventional AC power lines in the home by capacitor, so that said capacitor allows said power line signal to enter said power line transceiver but substantially prevents power from the conventional AC power lines in the home from entering said power line transceiver and thereby prevents damage to said power line transceiver.

9. The system as defined in claim 8, wherein said separate and local control system is partially enclosed in a housing which is replaceably plugged into the conventional AC power lines in the home by way of a conventional AC power line wall socket.

10. The system as defined in claim 9, wherein said infrared receiver is mounted in said housing at a position where it is in a direct line of sight with a large area of its environment.

11. The system as defined in claim 9, wherein said separate and local control system further includes a local switch that is mounted on said housing for locally manually actuating the associated one of the at least one of the at least one appliance and the at least one window, if so desired.

12. The system as defined in claim 9, wherein said housing of said separate and local control system has an appliance socket that is identical to the conventional AC power line wall socket which replaceably receives a conventional appliance plug of the at least one of at least one appliance and at least one window is an appliance.

13. The system as defined in claim 8; further comprising a dedicated receiver for receiving said infrared signal of said programmable infrared remote control and transmitting said power line signal over the home conventional AC power lines in the home using a dedicated power line transmitter when said programmable infrared remote control is not within range of any said infrared receiver, so that said dedicated receiver can act in effect as a relaying mechanism when the disabled person can not be moved in the range of said infrared receiver of any said separate and local control system.

14. The system as defined in claim 1; further comprising a timer for allowing the at least one of the at least one appliance and the at least one window to operate automatically without the disabled person having to manually operate said programmable infrared remote control each time operation thereof is desired.

15. The system as defined in claim 1; further comprising a buzzer for a sounding a sound for a short period of time prior to actual operation of any of the at least one of the at least one appliance and the at least one window and providing a warning that the any of the at least one of the at least one appliance and the at least one window is going to be operational.

16. The system as defined in claim 1; further comprising a window power relay and a window motor operatively connected to each window when any of the at least one of the at least one appliance and the at least one window is a window; each said window power relay controlling an associated said window motor upon receiving said infrared signal associated with a particular window of the at least one window.

* * * * *